United States Patent
Li et al.

(10) Patent No.: US 11,526,077 B2
(45) Date of Patent: Dec. 13, 2022

(54) POSITIVE PHOTORESIST COMPOSITION, VIA-FORMING METHOD, DISPLAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Wei Li, Beijing (CN); Tongshang Su, Beijing (CN); Guangyao Li, Beijing (CN); Yingbin Hu, Beijing (CN); Rui Ma, Beijing (CN); Jifeng Shao, Beijing (CN); Yang Zhang, Beijing (CN); Jianye Zhang, Beijing (CN)

(73) Assignees: BEIJING BOE TECHNOLOGY DEVELOPMENT CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 173 days.

(21) Appl. No.: 16/300,474

(22) PCT Filed: Apr. 25, 2018

(86) PCT No.: PCT/CN2018/084484
§ 371 (c)(1),
(2) Date: Nov. 9, 2018

(87) PCT Pub. No.: WO2019/024547
PCT Pub. Date: Feb. 7, 2019

(65) Prior Publication Data
US 2019/0146341 A1    May 16, 2019
US 2020/0225582 A9    Jul. 16, 2020

(30) Foreign Application Priority Data
Aug. 2, 2017   (CN) .................. CN201710651692.X (51) Int. Cl.
| | | |
|---|---|---|
| *G03F 7/022* | (2006.01) | |
| *G03F 7/039* | (2006.01) | |
| *H01L 27/12* | (2006.01) | |
| *G03F 7/26* | (2006.01) | |
| *G03F 7/031* | (2006.01) | |
| *G03F 7/16* | (2006.01) | |
| *G03F 7/20* | (2006.01) | |
| *H01L 21/027* | (2006.01) | |
| *G03F 7/085* | (2006.01) | |
| *G03F 7/40* | (2006.01) | |
| *H01L 21/311* | (2006.01) | |
| *G02F 1/1362* | (2006.01) | |

(52) U.S. Cl.
CPC ........ *G03F 7/039* (2013.01); *G02F 1/136227* (2013.01); *G03F 7/0226* (2013.01); *G03F 7/031* (2013.01); *G03F 7/085* (2013.01); *G03F 7/16* (2013.01); *G03F 7/2002* (2013.01); *G03F 7/26* (2013.01); *G03F 7/40* (2013.01); *H01L 21/0274* (2013.01); *H01L 21/31133* (2013.01); *H01L 21/31144* (2013.01); *H01L 27/1248* (2013.01); *H01L 27/1262* (2013.01); *H01L 27/1288* (2013.01)

(58) Field of Classification Search
CPC ........ G03F 7/0226; G03F 7/039; G03F 7/027; G03F 7/085
See application file for complete search history.

(56) References Cited

U.S. PATENT DOCUMENTS

| | | | |
|---|---|---|---|
| 4,237,207 A * | 12/1980 | Ceintrey | ............... G03C 1/685 430/17 |
| 4,444,869 A | 4/1984 | Chonan et al. | |
| 4,725,527 A | 2/1988 | Robillard | |
| 4,847,178 A * | 7/1989 | Komano | .................. G03C 1/72 430/191 |

(Continued)

FOREIGN PATENT DOCUMENTS

| | | |
|---|---|---|
| CN | 1491442 A | 4/2004 |
| CN | 1928233 A | 3/2007 |

(Continued)

OTHER PUBLICATIONS

China First Office Action, Application No. 201710651692.X, dated Apr. 25, 2019, 20 pps.: with English translation.
PCT International Search Report, Application No. PCT/CN2018/084484, dated Jul. 12, 2018, 7 pages: with English translation.
PCT Written Opinion, Application No. PCT/CN2018/084484, dated Jul. 12, 2018, 9 pages.: with English translation of relevant part.

*Primary Examiner* — Daborah Chacko-Davis
(74) *Attorney, Agent, or Firm* — Armstrong Teasdale LLP (57) ABSTRACT

The present disclosure provides a positive photoresist composition including a major adhesive material and a photosensitizer, wherein the photoresist composition further includes a photoisomerizable compound which would be converted into an ionic structure with an increased degree of molecular polarity after ultraviolet irradiation. The formation of the ionic structure with increased polarity of the molecule reduces the adhesion between the positive photoresist and the organic film layer, facilitates stripping after formation of the via, and improves the product rate of pass. Further, the present disclosure provides a via-forming method using the positive resist composition, a display substrate including the via formed by the via-forming method, and a display device including the display substrate.

4 Claims, 4 Drawing Sheets

(56) References Cited

U.S. PATENT DOCUMENTS

2003/0099910 A1* 5/2003 Kim .................... G03C 1/685
                                                                      430/345
2008/0311490 A1  12/2008 Norsten et al.
2009/0280060 A1* 11/2009 Marriott ............. C07D 209/08
                                                                       424/9.1

FOREIGN PATENT DOCUMENTS

| CN | 101799627 A | 8/2010 |
|----|-------------|--------|
| CN | 202837747 U | 3/2013 |
| CN | 103458618 A | 12/2013 |
| CN | 104093700 A | 10/2014 |
| CN | 104730864 A | 6/2015 |
| CN | 105283527 A | 1/2016 |
| CN | 106054528 A | 10/2016 |
| CN | 107422605 A | 12/2017 |
| JP | 57104937 A | 6/1982 |
| WO | 2017069172 A1 | 4/2017 |

* cited by examiner

POSITIVE PHOTORESIST COMPOSITION, VIA-FORMING METHOD, DISPLAY SUBSTRATE AND DISPLAY DEVICE

CROSS REFERENCE TO RELATED APPLICATIONS

This patent application is a National Stage Entry of PCT/CN2018/084484 filed on Apr. 25, 2018, which claims the benefit and priority of Chinese Patent Application No. 201710651692.X filed on Aug. 2, 2017, the disclosures of which are incorporated herein by reference in their entirety as part of the present application.

BACKGROUND

The present disclosure relates to the field of display technologies, and in particular, to a positive photoresist composition, a via-forming method using the positive photoresist composition, a display substrate including a via formed by the via-forming method, and a display device including the display substrate.

Photolithography process is an indispensable process in the fabrication of thin film transistor arrays, which plays a role in pattern transfer. A photoresist is coated on the clean film to be etched, and a designed mask pattern (i.e., a photoresist pattern) is obtained through processes such as soft baking, exposing, developing, and post-baking. Then, the exposed film region of the photoresist pattern is etched to form a target pattern conforming to the photoresist pattern, and the remaining photoresist pattern is stripped off to expose the target pattern for subsequent processing.

The implementation of a photolithography process is inseparable from photoresist. The major component of photoresist is a type of polymers containing a photosensitive group. Under ultraviolet irradiation, a series of chemical changes occur at the photosensitive group of the irradiated portion, resulting in a significant difference of solubility between the photosensitive portion and the unexposed portion of the photoresist in developer, thereby forming a specific pattern after developing.

Manufacture of thin film transistor arrays usually involves several photolithography processes, including a metal film process, an inorganic insulating layer (such as silicon oxide $SiO_x$, silicon nitride $SiN_x$) process, an active layer process, an ITO (Indium Tin Oxide) layer process, and the like. At present, in a manufacturing process of oxide-type array substrates (i.e., oxide back panel), an inorganic passivation layer (PVX) is usually coated with an organic film layer to protect the underlying film layer and provide a planarization substrate. The organic film layer has an organic film hole exposing the underlying PVX layer, and a via (i.e., via hole) process, specifically including photolithography, etching, and stripping process, is performed in the organic film hole to form a via on the PVX layer.

However, the organic film layer is usually composed of non-polar organic materials, and the main component polymers in the photoresist are also non-polar and organic (such as phenol-formaldehyde polymer), so the polarities of the two are similar. In the process of forming a via, the photoresist is directly coated on the organic film with similar polarity. The adhesion between the photoresist and the organic film layer is strong, thus the problem that the photoresist fails to be completely stripped off after via-etching is easy to occur, that is, the photoresist remains, which affects the subsequent process of the oxide back panel, and reduces the product rate of pass.

BRIEF DESCRIPTION

In view of this, in order to solve the problems of the prior art, the present disclosure provides a positive photoresist composition, a via-forming method using the positive photoresist composition, a display substrate including a via formed by the via-forming method, and a display device including the display substrate. The positive photoresist composition includes a photoisomerizable compound which would be converted into an ionic structure with an increased degree of molecular polarity after ultraviolet irradiation, thereby reducing the adhesion between the positive photoresist and the organic film layer, facilitating the stripping after formation of a via, and improving the product rate of pass.

The present disclosure adopts the following technical solutions:

In a first aspect, the present disclosure provides a positive photoresist composition including a major adhesive material and a photosensitizer, wherein the photoresist composition further includes a photoisomerizable compound which would be converted into an ionic structure with an increased degree of molecular polarity after ultraviolet irradiation.

The photoisomerizable compound may include at least one selected from the group consisting of a spiropyran compound, a spirooxazine compound, an aziridine compound, and a bipyridine compound.

As an alternative, the spiropyran compound has a structure of the following formula (I):

(I)

wherein $R_1$ is selected from the group consisting of an alkyl chain, an ether chain and, a phenyl group, and $R_2$ is a carboxyl group or a hydroxyl group. The aforementioned alkyl chain may be selected from the group consisting of butyl, pentyl and hexyl, and/or, the aforementioned ether chain is $(CH_2CH_2O)_mCH_3$, wherein m is an integer and $1 \leq m \leq 5$.

As another alternative, the spiropyran compound has a structure of the following formula (I'):

(I')

As still another alternative, the spiropyran compound has a structure of the following formula (II):

(II)

wherein n is an integer and 4≤n≤10; and R is a carboxyl group or a hydroxyl group.

The spirooxazine compound may have a structure of the following formula (III):

(III)

wherein $R_1$ is $CH_2CH_2OH$, and $R_2$ group is a carboxyl group or a hydroxyl group.

The aziridine compound may have a structure of the following formula (IV):

(IV)

wherein R is $C_2H_4OH$.

The bipyridine compound may have a structure of the following formula (V):

(V)

wherein $R_1$ is any one of hydrogen, methyl, ethyl, propyl, butyl, or an ether chain, $R_2$ is any one of carboxymethyl, carboxyethyl, or carboxypropyl, $R_3$ is any one of hydrogen, methyl, ethyl, propyl, butyl, or an ether chain, and $R_4$ is any one of carboxymethyl, carboxyethyl, or carboxypropyl.

The positive photoresist composition may further include a solvent and an additive.

In the positive photoresist composition, the major adhesive material accounts for 5% to 30% of the total weight of the positive photoresist composition, the photosensitizer may account for 2% to 5% of the total weight of the positive photoresist composition, the photoisomerizable compound may account for 0.1% to 2% of the total weight of the positive photoresist composition, the additive may account for 0.1% to 1% of the total weight of the positive photoresist composition, and the solvent may account for 62% to 92.8% of the total weight of the positive photoresist composition.

The major adhesive material may be a phenolic resin, and/or the photosensitizer is a diazonaphthoquinone type photosensitizer, and/or, the solvent is any one of N-methylpyrrolidone, dimethyl sulfoxide, propylene glycol monomethyl ether acetate, ethoxyethyl acetate, or dimethoxy acetaldehyde.

In a second aspect, the present disclosure provides a method for forming a via, including forming a passivation layer and an organic film layer successively on a substrate, with the organic film layer having a region exposing the passivation layer, forming a photoresist layer covering the organic film layer and the passivation layer, with the photoresist layer being formed from the positive photoresist composition of the present disclosure, and the organic film layer being similar in polarity to the positive photoresist composition before irradiation, processing the photoresist layer and the exposed passivation layer by a patterning process to form a via penetrating the passivation layer, and a photoresist remaining portion covering the organic film layer and the passivation layer exposed by the organic film layer, performing ultraviolet irradiation on the photoresist remaining portion to convert the structure of the photoisomerizable compound in the positive photoresist composition into an ionic structure having an increased degree of molecular polarity, and removing the photoresist remaining portion with a stripper.

The ultraviolet irradiation may have a wavelength range of 330 to 380 nm and an illumination intensity of 1 to 10 mW/CM².

In a third aspect, the present disclosure provides another method for forming a via, including forming an organic film layer and a photoresist layer successively on a substrate, with the photoresist layer being formed from the positive photoresist composition of the present disclosure, and the organic film layer being similar in polarity to the positive photoresist composition before irradiation, processing the photoresist layer and the organic film layer by a patterning process to form a via penetrating the organic film layer and a photoresist remaining portion covering the organic film layer except the region where the via is located, performing ultraviolet irradiation on the photoresist remaining portion to convert the structure of the photoisomerizable compound in the positive photoresist composition into an ionic structure having an increased degree of molecular polarity, and removing the photoresist remaining portion with a stripper.

The ultraviolet irradiation may have a wavelength range of 330 to 380 nm and an illumination intensity of 1 to 10 mW/CM$^2$ (milliwatts per square centimeter).

In the present disclosure, the organic film layer is similar in polarity to the positive photoresist composition before irradiation, which means that the polymer as a major component in the organic film layer is a non-polar or weakly polar organic resin, such as polymethyl methacrylate with the backbone chain being a non-polar organic carbon chain and the side chain being a weakly polar organic ester, and that the polymer as a major component in the positive photoresist composition is also a non-polar or weakly polar organic resin, such as a phenolic resin with the main chain being a non-polar organic carbon chain and the side chain being a weak polar ether chain. Therefore the polarities are similar.

In a fourth aspect, the present disclosure provides a display substrate, with a via on the display substrate formed by the via-forming method of the present disclosure.

In a fifth aspect, the present disclosure provides a display device including the display substrate of the present disclosure.

The display device of the present disclosure may include an LCD display, an LCD TV, an OLED display, an OLED TV, a mobile phone, a tablet computer, a digital photo frame, and a navigator.

Based on the aforesaid, the present disclosure provides a novel positive photoresist composition including a photoisomerizable compound which would be converted into an ionic structure with an increased degree of molecular polarity after ultraviolet irradiation, reducing the adhesion between the positive photoresist and the organic film layer, facilitating the stripping after the via formation, improving the product rate of pass of the TFT back panel on which the via is formed, and further improving the display quality of the LCD device and the OLED device based on the TFT back panel.

DETAILED DESCRIPTION

It should be noted that all terms (including technical and scientific terms) used in the present disclosure have the same meaning as commonly understood by persons skilled in the art to which the disclosure belongs, unless otherwise defined. It should also be understood that terms such as those defined in conventional dictionaries should be interpreted as having meanings consistent with their meanings in the context of the related art, and are not to be interpreted in terms of idealization or extreme formality unless explicitly stated herein.

For example, the terms "first", "second" and similar terms used in the specification and claims of the present disclosure are not intended to indicate any order, quantity or importance, and are merely used to distinguish different components. The words "include/including" or "comprise/comprising", and the like, are intended to mean that the elements or objects preceding the word are intended to cover the elements or the items that are listed after the word and their equivalents, and do not exclude other elements or items. The terms indicating a position or positional relationship, such as "on/above", or the like are based on the orientation or positional relationship shown in the drawings, and is merely for the convenience of the simplified description of the technical solutions of the present disclosure, but does not indicate or imply that the device or component referred to must have a specific orientation, be constructed and operated in a particular orientation, and thus the terms are not to be construed as a limit.

According to a first aspect of the present disclosure, there is provided a positive photoresist composition including a major adhesive material, a photosensitizer, and a photoisomerizable compound, wherein the photoisomerizable compound would be converted into an ionic structure with an increased degree of molecular polarity after ultraviolet irradiation.

It should be noted that the photoisomerizable compound is a photoinducing agent whose structural characteristic group is a closed-ring structure before ultraviolet irradiation. After ultraviolet irradiation of a certain wavelength, the closed-ring structure changes accompanying with change of polarity, and turns into an open-ring double-ion form with charge separation, and the electron arrangement changes to form an ionic compound-like structure (i.e., ionic structure) with uneven charge distribution. That is, the polarity increases after irradiation, and its molecular structure exhibits its polarity (or weak polarity).

Herein, the wavelength of the ultraviolet light can be flexibly adjusted according to the specific structure of the photoinducing photoisomerizable compound, which is not limited in the present disclosure.

The above-mentioned photoresist composition is positive. That means it is not dissolved in the developer before exposure, and after exposure to ultraviolet light, the chemical properties of the part irradiated by the ultraviolet light are changed, thus it can be dissolved in the developer so as to be removed.

In this way, when the photolithography process is performed with the above positive photoresist composition, the positive photoresist composition is exposed through a photo mask and developed to form an unexposed photoresist remaining portion and a removed region wherein the positive photoresist composition have been dissolved in the developer after irradiation. A corresponding etching process is performed on the film layer under the removed region of the photoresist to form a via. After the via is formed, ultraviolet irradiation toward the photoresist remaining portion can increase the polarity of the photoisomerizable compound and reduce the adhesion between the remaining photoresist and the underlying organic film layer, thereby facilitating the stripping of the remaining photoresist.

Based on the aforesaid, the present disclosure provides a novel positive photoresist composition including a photoisomerizable compound which would be converted into an ionic structure with an increased degree of molecular polarity after ultraviolet irradiation, reducing the adhesion between the positive photoresist and the organic film layer, facilitating the stripping after the via formation, improving the product rate of pass of the TFT (Thin Film Transistor) back panel on which the via is formed, and further improving the display quality of the LCD (Liquid Crystal Display) device and the OLED (Organic Light-Emitting Display) device based on the TFT back panel.

The positive photoresist composition of the present disclosure includes a major adhesive material. The major adhesive material is a photosensitive resin or a photoresist resin. After the resin is exposed to light, a photochemical reaction can occur rapidly in the exposed region, so that the physical properties, particularly solubility, and the like of the material change significantly. Any photosensitive resin that can be used in a positive photoresist composition can be used as the major adhesive material of the present disclosure. The major adhesive material provides adhesion and chemical resistance of the photoresist. Typically, as the major adhesive material, a phenol resin can be mentioned. The phenolic resin can be obtained by reacting a phenol compound with an aldehyde compound or a ketone compound in the presence of an acidic catalyst.

The positive photoresist composition of the present disclosure includes a photosensitizer in addition to the major adhesive material. The photosensitizer, sometimes referred to as a sensitizer, sensitizing agent, or sensibilizer, is a compound sensitive to light. For the purpose of the present disclosure, any photosensitizer suitable for a positive photoresist composition can be used in the present disclosure. As typical examples, diazonaphthoquinone type photosensitizers may be mentioned, such as 2,3,4,4'-tetrahydroxybenzophenone-2,1,4-diazonaphthoquinone sulfonate, 2,3,4-trihydroxybenzophenone-2,1,4-diazonaphthoquinone sulfonate, 2,3,4-trihydroxybenzophenone-2,1,5-diazonaphthoquinone sulfonate, and 2,3,4,4'-tetrahydroxybenzophenone-2,1,5-diazonaphthoquinone sulfonate. Diazonaphthoquinones can be obtained by reacting a diazonaphthoquinone sulfonyl halide compound with a phenol compound in the presence of a weak base.

The photoisomerizable compound of the present disclosure may include at least one selected from the group consisting of a spiropyran compound, a spirooxazine compound, an aziridine compound, and a bipyridine compound. Each of the above compounds has a photoisomerizable ring structure (particularly a photoisomerizable spiro-ring structure), and the (spiro-)ring may undergo ring opening after exposed to ultraviolet light to form a trans ionic structure.

Example compounds of the above respective compounds are described in detail below.

Spiropyran Compound

The spiropyran compound may have a structure of the following formula (I):

wherein $R_1$ is selected from the group consisting of an alkyl chain, an ether chain, a phenyl group, and the like, and $R_2$ is a carboxyl group or a hydroxyl group. The aforementioned alkyl chain may be selected from the group consisting of butyl, pentyl, and hexyl, and/or, the aforementioned ether chain is $(CH_2CH_2O)_mCH_3$, wherein m is an integer and $1 \leq m \leq 5$.

Herein, the developer is usually an alkaline aqueous solution of TMAH (tetra methyl ammonium hydroxide), and the mass fraction of TMAH is from 2% to 3%. In order to ensure that the above-mentioned positive photoresist can be removed by the developer in the developing unit after exposure, the $R_2$ group may be —COOH or —OH group, which is easily soluble in the alkaline solution.

The spiropyran compound may also have a structure of the following formula (I'):

The spiropyran compounds of the formulae (I) and (I') can be prepared by refluxing indole with dihydroxybenzaldehyde or hydroxycarboxybenzaldehyde in the presence of triethylamine in absolute ethanol.

Taking N-hydroxyethyl-6-hydroxyspiropyran of the formula (I') as an example, the spiropyran compound can be synthesized as follows:

First, 2,3,3-trimethylindole is reacted with iodoethanol to obtain N-hydroxyethyl-2,3,3-trimethylindolium iodide salt. Then, N-hydroxyethyl- 2,3,3-trimethylindolium iodide salt is reacted with 2,5-dihydroxybenzaldehyde in the presence of a basic catalyst to obtain N-hydroxyethyl-6-hydroxyspiropyran. The reaction of 2,3,3-trimethylindole with iodoethanol is usually carried out in a solvent such as acetonitrile, and it is advantageous to carry out the reaction under reflux. The reaction of N-hydroxyethyl-2,3,3-trimethylindolium iodide salt with 2,5-dihydroxybenzaldehyde is usually carried out also in a solvent such as ethanol, and it is advantageous to carry out the reaction at a temperature of 40 to 90° C. As the basic catalyst used in the reaction, it may be an organic base such as triethylamine, trimethylamine or the like.

If the compound of the formula (I) wherein $R_1$ is an ether chain $(CH_2CH_2O)_mCH_3$ is to be prepared, the iodoethanol in the above reaction may be changed to $I(CH_2CH_2O)_mCH_3$.

The compound of formula (I) wherein $R^1$ has other definitions can also be prepared by suitably modifying the starting material in the above preparation route. For example, in order to prepare the compound of formula (I) wherein $R^1$ is an alkyl chain or a phenyl group, the corresponding iodoalkane or iodobenzene of the formula $(IR^1)$ may be used, wherein $R^1$ is an alkyl chain such as butyl, pentyl or hexyl, or phenyl. As the compound of the formula (I) wherein $R^2$ is a hydroxyl group, hydroxycarboxybenzaldehyde can be used instead of dihydroxybenzaldehyde.

The spiropyran compound according to the present disclosure may also have a structure of the following formula (II):

The spiropyran groups at both ends of the compound of the formula (II) can be isomerized under ultraviolet irradiation to form a polar trans ionic structure by ring opening. n in the formula (II) is an integer of 4 to 10 to ensure the compatibility of the spiropyran compound as an inducer in the above positive photoresist composition, and to ensure a certain adhesion between the photoresist layer and the organic film layer before irradiation to avoid adhesive failure before irradiation and affecting the subsequent film etching. The R group may be a —COOH or —OH group to ensure that the irradiated portion is removed in the developing unit after ultraviolet irradiation.

The spiropyran compound of the formula (II) can be obtained by reacting a dicarboxy PEG (polyethylene glycol) with a hydroxyethyl spiropyran in the presence of a basic catalyst such as DMAP (4-dimethylaminopyridine). The reaction can be represented as follows:

The spiropyran compound undergoes isomerization of the molecular structure under ultraviolet irradiation, in which the spirocarbon-oxygen bond is heterolyzed, and ring-opening occurs to form a trans ionic structure with charge separation. Taking the spiropyran compound of the formula (I) as an example, the isomerization process under ultraviolet irradiation can be represented as follows:

wherein in the case of spiropyran compounds under irradiation with ultraviolet light (ultraviolet, UV), the spirocarbon-oxygen bond is heterolyzed, and ring-opening occurs to form a trans ionic structure with charge separation. The neutral SP structure (i.e., the spiro structure) is turned into a more polar MC structure (i.e., the cyanine open-ring structure), which increases the hydrophilicity after irradiation. That is, the polarity increases. The structural changes caused by irradiation can be proved by ultraviolet absorption spectrums of the spiropyran solution before and after irradiation.

Spirooxazine Compound

The spirooxazine compound of the present disclosure may have a structure of the following formula (III):

wherein the $R_1$ group is $CH_2CH_2OH$, the $R_2$ group may be a —COOH or —OH group, to ensure that the irradiated portion is removed in the developing unit after ultraviolet irradiation.

The spirooxazine compound of the formula (III) can be prepared by refluxing indole with nitrosophenol in absolute ethanol. Taking N-hydroxyethyl-5'-carboxy-5,7-dimethoxyspirobenzoxazine as an example, the synthesis of the spirooxazine compound can be represented as follows:

First, 2,3,3-trimethyl-5'-carboxyindole is reacted with iodoethanol to obtain N-hydroxyethyl-2,3,3-trimethyl-5'-carboxyindolium iodide salt. Then, N-hydroxyethyl-2,3,3-trimethyl-5'-carboxyindolium iodide salt is reacted with 2-nitroso-3,5-dimethoxyphenol in the presence of a basic catalyst to give N-hydroxyethyl-5'-carboxy-5,7-dimethoxyspirobenzoxazine. The reaction of 2,3,3-trimethyl-5'-carboxyindole with iodoethanol is usually carried out in a solvent such as acetonitrile, and it is advantageous to carry out the reaction under reflux. The reaction of N-hydroxyethyl-2,3,3-trimethyl-5'-carboxyindolium iodide salt with 2-nitroso-3,5-dimethoxyphenol is usually carried out also in a solvent such as ethanol, and it is advantageous to carry out the reaction at a temperature of 40 to 90° C. As the basic catalyst used in the reaction, it may be an organic base such as triethylamine, trimethylamine or the like.

As for the preparation of the compound of the formula (III) wherein $R_2$ is —OH, it can be prepared in a similar manner to N-hydroxyethyl-5'-carboxy-5,7-dimethoxyspirobenzoxazine, except that the 2,3,3-trimethyl-5'-carboxyindole starting material is replaced with 2,3,3-trimethyl-5'-hydroxyindole.

The isomerization process of the spirooxazine compound of formula (III) under certain ultraviolet irradiation (labeled as hv in the figure) can be represented as follows:

wherein, the spirocarbon-oxygen bond in the compound of the formula (III) is heterolyzed, and the ring opening forms a trans ionic structure with charge separation. The molecular polarity increases.

Aziridine Compound

The aziridine compound of the present disclosure may have a structure of following formula (IV):

(IV)

wherein, the R group is $C_2H_4OH$, to ensure that the irradiated portion is removed in the developing unit after ultraviolet irradiation.

The isomerization process of the aziridine compound of formula (IV) under ultraviolet irradiation (labeled as hv in the figure) can be represented as follows:

wherein the carbon-carbon bond breaks to open the ring, which forms a trans ionic structure with charge separation. The molecular polarity increases.

Bipyridine Compound

The bipyridine compound of the present disclosure may have a structure of the following formula (V):

(V)

wherein $R_1$ is any one of hydrogen, methyl, ethyl, propyl, butyl or an ether chain, $R_2$ is any one of carboxymethyl, carboxyethyl or carboxypropyl, $R_3$ is any one of hydrogen, methyl, ethyl, propyl, butyl, or an ether chain, and $R_4$ is any one of carboxymethyl, carboxyethyl, or carboxypropyl.

The isomerization process of the bipyridine compound of formula (V) under ultraviolet irradiation (labeled as hv in the figure) and heat treatment (labeled as Heat in the figure) can be represented as follows:

wherein the carbon-carbon bond is broken, and the ring-opening forms a trans ionic structure with charge separation. The molecular polarity increases.

In one embodiment, the positive photoresist composition of the present disclosure may further include a solvent and an additive. It will be apparent that the additives herein are additives other than the photosensitizer and the photoinducing agent described above. Examples of the additive may include a surfactant, which is used for improving coating performances of the photoresist, and preventing radial coating unevenness (Mura) of the photoresist, and a sensitizing agent, which is used for improving exposure sensitivity.

The solvent gets the photoresist in a liquid state and allows the photoresist to be applied on the surface of the wafer by a rotating method to form a thin layer. The positive photoresist composition of the present disclosure is not particularly limited with respect to the selection of the solvent, and any solvent suitable for the positive photoresist composition may be used therein. As examples of the solvent, N-methyl-2-pyrrolidone (NMP), dimethyl sulfoxide (DMSO), propylene glycol monomethyl ether acetate, ethoxyethyl acetate, and dimethoxyacetaldehyde may be mentioned. Any one of these solvents can be used.

In one embodiment of the present disclosure, the composition of the positive photoresist composition of the present disclosure may be as follows: the major adhesive material accounts for 5% to 30% of the total weight of the positive photoresist composition, the photosensitizer accounts for 2% to 5% of the total weight of the positive photoresist composition, the photoisomerizable compound accounts for 0.1% to 2% of the total weight of the positive photoresist composition, the additive accounts for 0.1% to 1% of the total weight of the positive photoresist composition and the balance is the solvent, that is, the solvent accounts for 62% to 92.8% of the total weight of the positive photoresist composition.

The corresponding stripper to the positive photoresist of the present disclosure may include a base having a mass fraction of 10% to 30%, which may be MEA (monoethanolamine), KOH, NaOH, and the like, an ether having a mass fraction of 50% to 70%, which may be diethylene glycol monobutyl ether (butyldigol, BDG). Specific components may be those used in the prior art, which are not limited in the present disclosure.

Figure 7A:
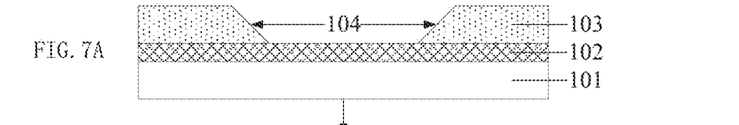
FIGS. 7A-7E are schematic flow charts of a method for forming a via according to the present disclosure.
Figure 7B:
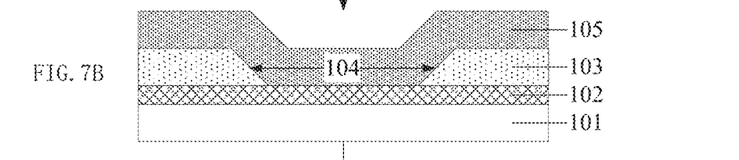
Figure 7C:
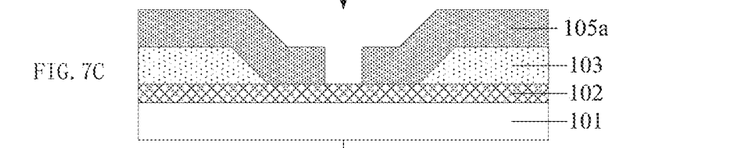
Figure 7D:
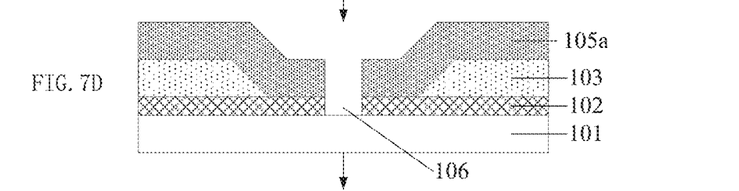
Figure 7E:
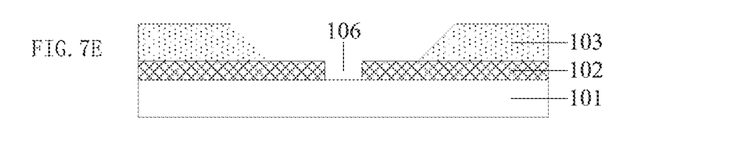

According to a second aspect of the present disclosure, there is provided a method for forming a via, including as shown in FIG. 7A, forming a passivation layer 102 and an organic film layer 103 (which has a non-polar or weak polarity) successively on a substrate 101, with the organic film layer 103 having a region exposing the passivation layer (i.e., the organic film via 104), as shown in FIG. 7B, forming a photoresist layer 105 covering the organic film layer 103 and the passivation layer 102 by for example, a coating process, with the photoresist layer 105 being formed from the positive photoresist composition of the present disclosure, and the organic film layer 103 being similar in polarity to the positive photoresist composition before irradiation, that is, the adhesion of the photoresist layer 105 on the non-polar or weakly-polar organic film layer 103 is comparatively strong, as shown in FIG. 7C and FIG. 7D, processing the photoresist layer 105 and the exposed passivation layer 102 by a patterning process to form a via 106 penetrating the passivation layer 102, and a photoresist remaining portion 105a covering the organic film layer 103 and the passivation layer 102 exposed by the organic film layer 103, performing ultraviolet irradiation on the photoresist remaining portion to convert the structure of the photoisomerizable compound in the positive photoresist composition into an ionic structure having an increased degree of molecular polarity, that is, the adhesion between the photoresist remaining portion 105a and the organic film layer 103 in contact therewith being weaken, and as shown in FIG. 7E, removing the photoresist remaining portion with a stripper.

It should be noted that, in the above-mentioned via-forming method provided by the second aspect of the present disclosure, the organic film layer 103 is usually composed of a photoresist material, and is directly exposed through a photo mask and developed to form a corresponding organic film via 104. Thus, there is no problem of photoresist residue.

The above-described patterning process refers to a process of applying a photo mask once to form a specific pattern by exposing of photoresist, developing, and etching. The specific procedure for processing the photoresist layer 105 and the exposed passivation layer 102 by a patterning process to form a via 106 penetrating the passivation layer 102, and a photoresist remaining portion 105a covering the organic film layer 103 and the passivation layer 102 exposed by the organic film layer 103 may include exposing the coated photoresist layer 105 through a photo mask and developing to form a photoresist remaining portion 105a and a photoresist removed region, wherein the photoresist removed region corresponds to a region of the passivation layer 102 where the via is to be formed, and the passivation layer 102 exposed by the photoresist removed region is etched by plasma dry etching to form a via 106 penetrating the passivation layer.

Before the remaining photoresist remaining portion 105a is stripped off, an ultraviolet irradiation unit is added to perform irradiation treatment on the entire substrate. The wavelength range may be 330 to 380 nm, and the illumination intensity may be 1 to 10 mW/CM$^2$. Thereafter, conventional photoresist stripping is performed to obtain a target pattern, that is, a substrate having a passivation layer via is formed.

The present disclosure also provides another method for forming a via, with respect to an organic film layer which is composed of a non-photoresist material and needs to be etched to form a via pattern.

Therefore, according to the third aspect of the present disclosure, there is provided another method for forming a via, including forming an organic film layer and a photoresist layer successively on a substrate, with the photoresist layer being formed from the positive photoresist composition of the present disclosure, and the organic film layer being similar in polarity to the positive photoresist composition before irradiation, processing the photoresist layer and the organic film layer by a patterning process to form a via penetrating the organic film layer and a photoresist remaining portion covering the organic film layer except the region where the via is located, performing ultraviolet irradiation on the photoresist remaining portion to convert the structure of the photoisomerizable compound in the positive photoresist composition into an ionic structure having an increased degree of molecular polarity, and removing the photoresist remaining portion with a stripper.

Likewise, in the method for forming a via provided by the third aspect, before the remaining photoresist remaining portion is stripped off, an ultraviolet irradiation unit is added to perform irradiation treatment on the entire substrate. The wavelength range may be 330 to 380 nm, and the illumination intensity may be 1 to 10 mW/CM$^2$. Thereafter, conventional photoresist stripping is performed to obtain a target pattern, that is, a substrate having an organic film via is formed.

For the specific formation steps, reference can be made to the corresponding description in the via-forming method in the second aspect above, and details are not described herein again.

According to a fourth aspect of the present disclosure, there is provided a display substrate with a via formed by the via-forming method of the present disclosure. The display substrate may specifically be an array substrate.

According to a fifth aspect of the present disclosure, there is provided a display device including the above display substrate. The display device may specifically be a product or component having any display function, such as an LCD display, an LCD TV, an OLED display, an OLED TV, a digital photo frame, a mobile phone, a tablet computer, a digital photo frame, a navigator, and the like.

EXAMPLES

The disclosure is further illustrated by the following examples, which should not be construed as limiting the scope of the disclosure.

Example 1: Preparation of N-Hydroxyethyl-6-Hydroxyspiropyran (c) of Formula (I')

Iodoethanol (1.36 g, 8 mmol) was weighed and dissolved in 10 ml of acetonitrile and degassed by passing nitrogen for 30 minutes. 2,3,3-trimethylindole (a) (1.274 g, 8 mmol) was weighed and dissolved in 5 ml of acetonitrile, and added dropwise to the reaction solution with a dropping funnel in about 1 hour. The reflux was continued for 36 hours. The reaction was completed, cooled, and acetonitrile was removed by rotary evaporation. It was washed several times with n-hexane and several times with diethyl ether to give N-hydroxyethyl-2,3,3-trimethylindolium iodide salt (b). The obtained N-hydroxyethyl-2,3,3-trimethylindolium iodide salt (1.31 g, 4 mmol) and 1 ml of triethylamine were dissolved in 20 ml of ethanol, and added to a three-necked bottle and degassed by passing nitrogen for 30 minutes. 2,5-dihydroxybenzaldehyde (0.68 g, 5 mmol) was weighed and dissolved in 5 ml of ethanol, and slowly added to the reaction solution at 45° C. with a syringe, and the addition was completed in 15 minutes. The temperature was raised to 70° C., and the reaction was kept for 0.5 hours, the temperature was raised to 80° C., and the reaction was kept for 2.5 hours, and the temperature was further raised to 90° C. to continue the reaction for 2.5 hours. The reaction was terminated, cooled, and the reaction solution was dark red. The ethanol was removed by rotary evaporation to give a dark red viscous material, which was dissolved in 60 ml of $CH_2Cl_2$ and washed with water several times to remove excess salicylaldehyde. The $CH_2Cl_2$ phases were collected, and rotary evaporated to dryness to give a dark red solid, which was recrystallized from n-hexane to give the desired product, N-hydroxyethyl-6-hydroxyspiropyran (c).

$^1$H NMR: δ 1.12 (s, 3H, —CH$_3$), 1.27 (s, 3H, —CH$_3$), 3.27-4.06 (m, 4H, —NCH$_2$CH$_2$O—), 5.68 (d, 1H, —CH═), 6.68 (d, 1H, ═CH—), 6.47-7.12 (m, 7H, Ar—H), 5.13 (d, 2H, Ar—OH).

Figure 1:
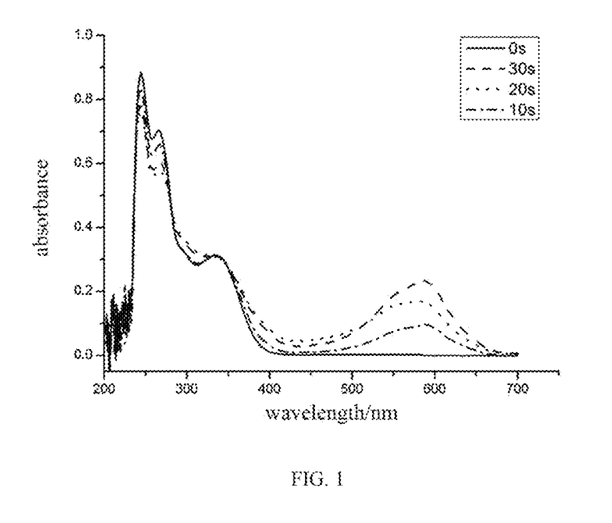
FIG. 1 is a graph showing changes in ultraviolet absorption spectrum of a tetrahydrofuran solution of N-hydroxyethyl-6-hydroxyspiropyran prepared in Example 1 of the present disclosure with different irradiation times.

Changes in the UV-visible absorption spectrum of a tetrahydrofuran solution of the compound (c) (a concentration of 0.01 mg/ml) before and after irradiation with ultraviolet light having a wavelength of 365 nm and an illumination intensity of 10 mW/cm$^2$ at room temperature are shown in FIG. 1.

It can be seen from FIG. 1 that before irradiation (irradiation 0 s), the system had no absorption in the visible light region (400 to 700 nm), and an absorption peak appeared at 590 nm after ultraviolet irradiation, which increased with the increase of irradiation time. The absorption peak belonged to the absorption peak of the cyanine open-ring structure, indicating that the irradiation caused the opening of the ring. The ionic structure formed by the ring-opening resulted in an increase in polarity, that is, an increase in hydrophilicity. In water phase or other strongly polar dispersants, an increase in hydrophilicity will reduce the interfacial tension of the dispersant on its surface. This can be verified by the fact that the wetting angle is significantly reduced after UV radiation.

Figure 2:
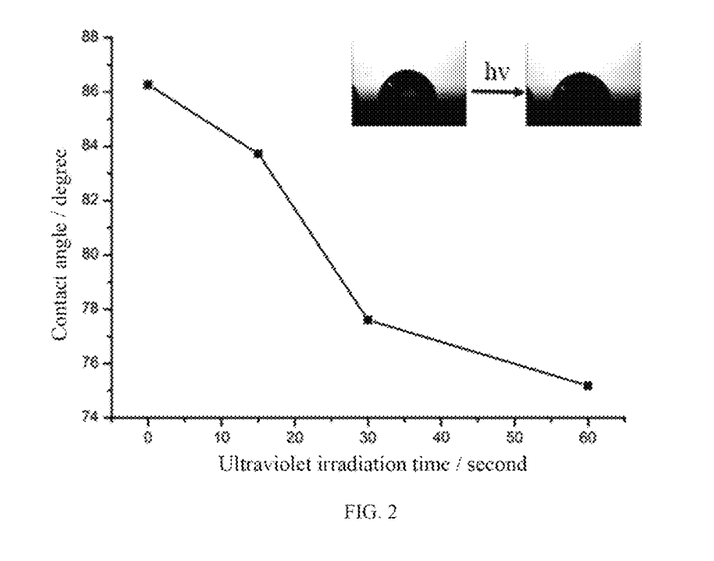
FIG. 2 is a graph showing changes in contact angle of a water droplet on the surface of an N-hydroxyethyl-6-hydroxyspiropyran/phenolic resin film prepared in Example 1 of the present disclosure under ultraviolet irradiation.

The change in contact angle of water on the surface of the N-hydroxyethyl-6-hydroxyspiropyran/phenolic resin film is shown in FIG. 2. The experiment was carried out as follows: N-hydroxyethyl-6-hydroxyspiropyran and phenolic resin (Mn=10000 g/mol) were dissolved in tetrahydrofuran such that the concentration of N-hydroxyethyl-6-hydroxyspiropyran was 5 mg/ml and the concentration of the phenolic resin was 200 mg/ml. The obtained solution was coated on a glass substrate, air-dried into a film, dropped with water droplets thereon, and then irradiated with UV light having a wavelength of 365 nm at an illumination intensity of 10 mW/cm$^2$ to observe the change in the contact angle of the water droplets with the irradiation time. It can be seen from FIG. 2 that under the UV illumination intensity of 10 mW/cm$^2$, the contact angle decreased from the initial 86° to 75° in one minute, which indicated that the interfacial tension of N-hydroxyethyl-6-hydroxyspiropyran compound was lowered after the ultraviolet irradiation, and the hydrophilicity increased, that is, the polarity increased. The UV-visible absorption spectrum proved that the reason for the increase in polarity was that after the spiropyran was irradiated by ultraviolet light, the C—O bond of the spiro ring structure was broken to form a trans ionic open-ring structure.

Example 2: Preparation of Spiropyran (f) of Formula (II)

1 g of dicarboxy PEG (n=4) (e) and 2 g of hydroxyethyl spiropyran (d) with R being a hydroxyl group were dissolved in 20 ml of dry tetrahydrofuran at room temperature, stirred and uniformly dispersed, then 10 mg of catalyst DMAP was added. Separately, 5 ml of a solution of 1.5 g of dicyclohexylcarbodiimide (DCC) in tetrahydrofuran was prepared, then was added dropwise to the obtained reaction mixture in 30 minutes, and the reaction was continued for 48 hours with stirring at room temperature. The reaction mixture was filtered, and the filtrate was concentrated to 5 ml. Then, the filtrate was dropped into 40 ml of cyclohexane to precipitate, the supernatant was removed. The precipitate was dissolved in 5 ml of tetrahydrofuran, and again precipitated by dropping into 40 ml of cyclohexane. The procedure was repeated again, and the precipitate was dried to obtain the target product (f) wherein R was a hydroxyl group.

$^1$H NMR: δ 1.12 (s, 6H, —CH$_3$), 1.27 (s, 6H, —CH$_3$), 3.27-4.06 (m, 24H, —NCH$_2$CH$_2$OOCCH$_2$CH$_2$OCH$_2$CH$_2$OCH$_2$CH$_2$OCH$_2$CH$_2$OOCCH$_2$CH$_2$N—), 5.68 (d, 2H, —CH═), 6.68 (d, 2H, ═CH—), 6.47-7.12 (m, 14H, Ar—H), 5.13 (d, 2H, Ar—OH).

Figure 3:
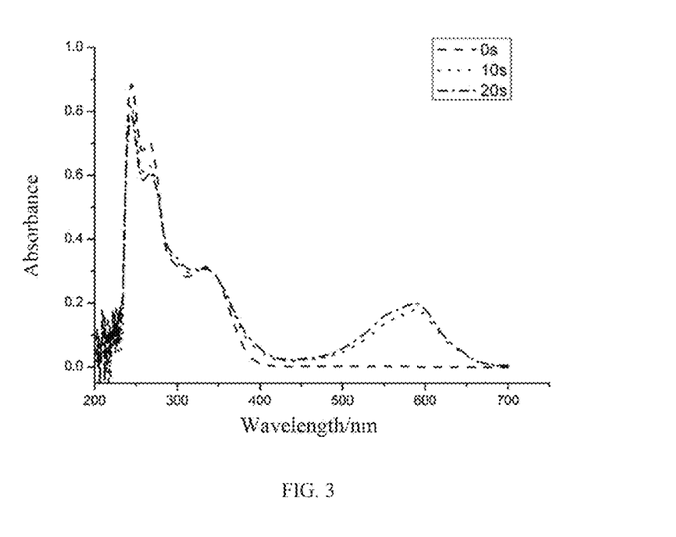
FIG. 3 is a graph showing the changes in ultraviolet absorption spectrum of a tetrahydrofuran solution of spiropyran (f) prepared in Example 2 of the present disclosure with different irradiation times.

Changes in the UV-visible absorption spectrum of a tetrahydrofuran solution of the spiropyran (f) (a concentration of 0.01 mg/ml) before and after irradiation with ultraviolet light having a wavelength of 365 nm and an illumination intensity of 10 mW/cm$^2$ at room temperature are shown in FIG. 3.

It can be seen from FIG. 3 that before irradiation (irradiation 0 s), the system had no absorption in the visible light region (400 to 700 nm), and an absorption peak appeared at 590 nm after ultraviolet irradiation, which increased with the increase of irradiation time. The absorption peak belonged to the absorption peak of the cyanine open-ring structure, indicating that the irradiation caused the opening of the ring. The ionic structure formed by the ring-opening resulted in an increase in polarity, that is, an increase in hydrophilicity. In a water phase or other strongly polar dispersants, an increase in hydrophilicity will reduce the interfacial tension of the dispersant on its surface. This can be verified by the fact that the wetting angle is significantly reduced after UV radiation.

Figure 4:
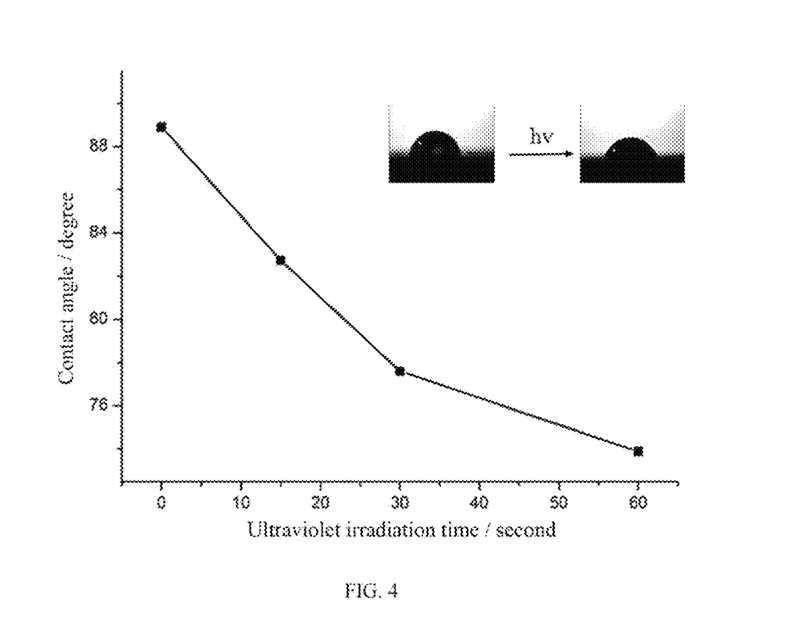
FIG. 4 is a graph showing the changes in contact angle of a water droplet on the surface of a spiropyran (f)/phenolic resin film prepared in Example 2 of the present disclosure under ultraviolet irradiation.

The change in contact angle of water on the surface of spiropyran (f)/phenolic resin film is shown in FIG. 4. The experiment was carried out as follows: spiropyran (f) and the phenolic resin (Mn=10000 g/mol) were dissolved in tetrahydrofuran such that the concentration of spiropyran (f) was 10 mg/ml and the concentration of the phenolic resin was 200 mg/ml. The obtained solution was coated on a glass substrate, air-dried into a film, dropped with water droplets thereon, and then irradiated with UV light having a wavelength of 365 nm at an illumination intensity of 10 10 mW/cm$^2$ to observe the change in the contact angle of the water droplets with the irradiation time. It can be seen from FIG. 4 that under the UV illumination intensity of 10 mW/cm$^2$, the contact angle decreased from the initial 89° to 74° in one minute, which indicated that the interfacial tension of spiropyran (f) was lowered after the ultraviolet irradiation, and the hydrophilicity increased, that is, the polarity increased. The UV-visible absorption spectrum proved that the reason for the increase in polarity was that after spiropyran (f) was irradiated by ultraviolet light, the C—O bond of the spiro ring structure was broken to form a trans ionic open-ring structure.

Example 3: Preparation of N-hydroxyethyl-5'-carboxy-5,7-dimethoxyspirobenzoxazine (i)

i

Iodoethanol (1.36 g, 8 mmol) was weighed and dissolved in 10 ml of acetonitrile and degassed by passing nitrogen for 30 minutes. 2,3,3-trimethyl-5'-carboxyindole (g) (1.3 g, 8 mmol) was weighed and dissolved in 5 ml of acetonitrile, and added dropwise to the reaction solution with a dropping funnel in about 1 hour. The reflux was continued for 36 hours. The reaction was completed, cooled, and acetonitrile was removed by rotary evaporation. It was washed several times with n-hexane and several times with diethyl ether to give N-hydroxyethyl-2,3,3-trimethyl-5'-carboxyindolium iodide salt (h). The resulting N-hydroxyethyl-2,3,3-trimethyl-5-carboxyindolium iodide salt (1.3 g, 4 mmol) and 1 ml of triethylamine were dissolved in 20 ml of ethanol, and added to a three-necked flask and degassed by passing nitrogen for 30 minutes. 2-nitroso-3,5-dimethoxyphenol (0.9 g, 5 mmol) was weighed and dissolved in 5 ml of ethanol, and slowly added to the reaction solution at 45° C. with a syringe, and the addition was completed in 15 minutes. The temperature was raised to 70° C., and the reaction was kept for 0.5 hours, the temperature was raised to 80° C., and the reaction was kept for 2.5 hours, and the temperature was further raised to 90° C. to continue the reaction for 2.5 hours. The reaction was terminated, cooled, and the reaction solution was dark red. The ethanol was removed by rotary evaporation to give a dark red viscous material, which was dissolved in 60 ml of $CH_2Cl_2$ and washed with water several times to remove excess salicylaldehyde. The $CH_2Cl_2$ phases were collected, and rotary evaporated to dryness to give a dark red solid, which was recrystallized from n-hexane to give the desired product N-hydroxyethyl-5'-carboxy-5,7-dimethoxyspirobenzoxazine (i).

$^1$H NMR: δ 1.12 (s, 3H, —$CH_3$), 1.27 (s, 3H, —$CH_3$), 2.0 (s, 6H, —$OCH_3$), 3.27-4.06 (m, 4H, —$NCH_2CH_2O$—), 5.68 (d, 1H, —CH═), 6.68 (d, 1H, ═CH—), 6.8-8.0 (m, 5H, Ar—H), 5.13 (d, 2H, Ar—OH).

Figure 5:
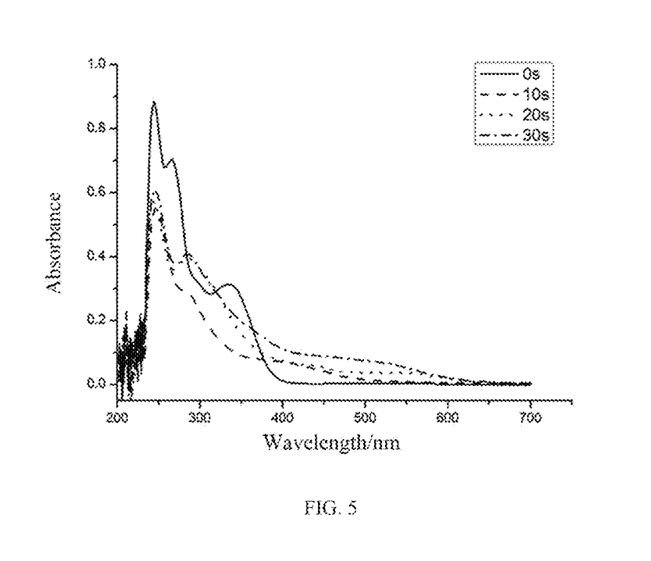
FIG. 5 is a graph showing the changes in ultraviolet absorption spectrum of a tetrahydrofuran solution of N-hydroxyethyl-5'-carboxy-5,7-dimethoxyspirobenzoxazine prepared in Example 3 of the present disclosure under different irradiation times.

Changes in the UV-visible absorption spectrum of a tetrahydrofuran solution of the compound (i) (a concentration of 0.01 mg/ml) before and after irradiation with ultraviolet light having a wavelength of 365 nm and an illumination intensity of 10 mW/cm$^2$ at room temperature are shown in FIG. 5.

It can be seen from FIG. 5 that before irradiation (irradiation 0 s), the system had no absorption in the visible light region (400 to 700 nm), and an absorption peak appeared at 590 nm after ultraviolet irradiation, which increased with the increase of irradiation time. The absorption peak belonged to the absorption peak of the oxazine open-ring trans ionic structure, indicating that the irradiation caused the opening of the ring. The ionic structure formed by the ring-opening resulted in an increase in polarity, that is, an increase in hydrophilicity.

Figure 6:
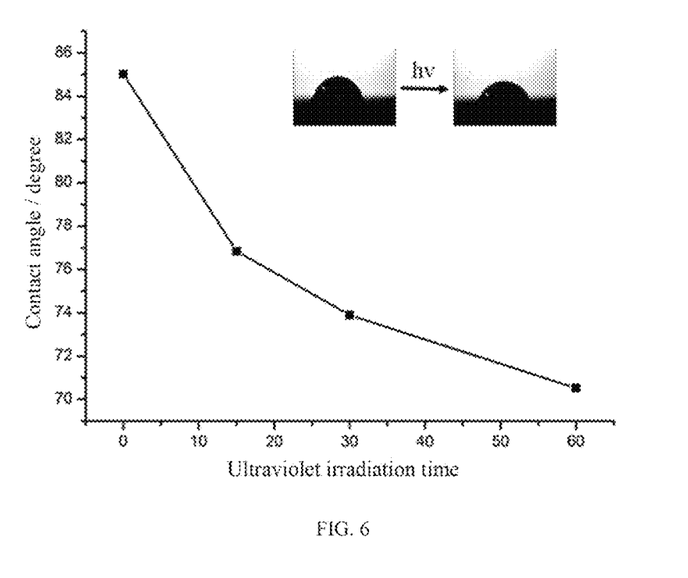
FIG. 6 is a graph showing the changes in contact angle of a water droplet on the surface of N-hydroxyethyl-5'-carboxy-5,7-dimethoxyspirobenzoxazine/phenolic resin film prepared in Example 3 of the present disclosure under ultraviolet irradiation.

The change in contact angle of water on the surface of the N-hydroxyethyl-5'-carboxy-5,7-dimethoxyspirobenzoxazine/phenolic resin film is shown in FIG. 6. The experiment was carried out as follows: N-hydroxyethyl-5'-carboxy-5,7-dimethoxyspirobenzoxazine (i) and phenolic resin (Mn=10000 g/mol) were dissolved in tetrahydrofuran such that the concentration of N-hydroxyethyl-5'-carboxy-5,7-dimethoxyspirobenzoxazine (i) was 5 mg/ml and the concentration of phenolic resin was 200 mg/ml. The obtained solution was coated on a glass substrate, air-dried into a film, dropped with water droplets thereon, and then irradiated with UV light having a wavelength of 365 nm at an illumination intensity of 10 10 mW/cm$^2$ to observe the change in the contact angle of the water droplets with the irradiation time.

It can be seen from FIG. 6 that under the UV illumination intensity of 10 mW/cm$^2$, the contact angle decreased from the initial 85° to 70° in one minute, which indicated that the interfacial tension of the compound (i) was lowered after the ultraviolet irradiation, and the hydrophilicity increased, that is, the polarity increased. The UV-visible absorption spectrum proved that the reason for the increase in polarity was that after the spirooxazine was irradiated by ultraviolet light, the C—O bond of the spiro ring structure was broken to form a trans ionic open-ring structure.

The aforesaid are only example embodiments of the present disclosure, but the scope of the present disclosure is not limited thereto, and any person skilled in the art can easily think of changes or substitutions within the technical scope disclosed in the present disclosure, which should be covered by the scope of the present disclosure. Therefore, the scope of the disclosure should be determined by the scope of the appended claims.

What is claimed is:

1. A positive photoresist composition for forming a via on a display substrate, which comprises a photosensitive resin and a photosensitizer, wherein the photoresist composition further comprises a photoisomerizable compound convertible into an ionic structure with an increased degree of molecular polarity after ultraviolet irradiation;
    wherein the photoisomerizable compound is a spirooxazine compound;
    wherein the spirooxazine compound has a structure of the following formula (III):

and wherein $R_1$ is $CH_2CH_2OH$ and $R_2$ is a carboxyl group or a hydroxyl group.

2. The positive photoresist composition according to claim 1, wherein the positive photoresist composition further comprises a solvent and an additive.

3. The positive photoresist composition according to claim 2, wherein
    the photosensitive resin accounts for 5% to 30% of a total weight of the positive photoresist composition;
    the photosensitizer accounts for 2% to 5% of the total weight of the positive photoresist composition;
    the photoisomerizable compound accounts for 0.1% to 2% of the total weight of the positive photoresist composition;

the additive accounts for 0.1% to 1% of the total weight of the positive photoresist composition; and the solvent accounts for 62% to 92.8% of the total weight of the positive photoresist composition.

4. The positive photoresist composition according to claim 2, wherein the photosensitive resin is a phenolic resin;

the photosensitizer is a diazonaphthoquinone type photosensitizer; and the solvent is selected from the group consisting of N-methylpyrrolidone, dimethyl sulfoxide, propylene glycol monomethyl ether acetate, ethoxyethyl acetate, and dimethoxy acetaldehyde.

* * * * *